United States Patent Office 2,788,382

Patented Apr. 9, 1957

2,788,382

TELLURIUM-BISMUTH THERMOELECTRIC ELEMENT

Harold T. Faus, Lynn, and Donald E. Ridgley, Beverly, Mass., assignors to General Electric Company, a corporation of New York No Drawing. Application August 7, 1952, Serial No. 303,166

3 Claims. (Cl. 136—5)

The present invention relates to a novel tellurium-bismuth thermoelectric element and is more particularly concerned with an improved thermocouple comprising such element.

An object of the present invention is to provide a thermoelectric element having a high thermoelectric power and a linear temperature-E. M. F. curve.

A further object of the invention is to provide a positive thermoelectric element having a low electrical resistance combined with a high thermoelectric power.

Another object of the invention is to provide a stable, positive thermoelectric element having thermoelectric and resistivity characteristics not materially affected by repeated temperature changes or prolonged heating at elevated temperatures.

These objects and others which will become apparent from the following description are obtained in accordance with the present invention by providing a new and improved thermoelectric element composed of tellurium and from 0.01 to 0.1 percent by weight bismuth. Preferred elements within the scope of the present invention are those containing from about 0.03 to 0.10 percent by weight bismuth, balance pure tellurium except for spectrographic traces of impurities such as copper, magnesium, lead and silicon.

The thermoelectric elements of the present invention are characterized specifically by a high thermal E. M. F. of at least 300 microvolts per degree against copper, and are particularly useful in thermocouple instruments for high frequency measurements, thermal wattmeters, and radiation pyrometers.

The thermoelectric alloys used in the manufacture of the elements of the present invention are prepared by melting a mixture of bismuth and pure tellurium in the indicated proportions and casting the alloy into a form suitable for use in the thermoelectric device. A heat treatment of the elements at a temperature somewhat above the intended use temperature is usually desirable to stabilize the electrical characteristics of the alloys. The tellurium employed must be substantially pure. Many commercial grades of tellurium are not suitable for the practice of the present invention in that they contain more than spectrographic traces of copper, magnesium, lead, bismuth and silicon. In fact, some commercial grades of tellurium have been found to contain as much as 0.2 percent bismuth and are therefore not suitable for the practice of the present invention.

It has been previously known or suggested that tellurium and tellurium alloys be employed in the manufacture of thermoelectric elements for use, for example, in thermopiles. Such elements are described, for example, in the article entitled "The design of fast thermopiles," by Hornig et al., Review of Scientific Instruments, July 1947. Pure tellurium is not particularly useful as a thermoelectric material due to its low, and in some cases negative, thermal E. M. F. coupled with a high electrical resistivity which has been reported in the neighborhood of 0.35 ohm per centimeter. In addition, pure tellurium has a non-linear temperature E. M. F. curve and its thermoelectric properties are not uniform or stable. They vary with changes in the casting temperatures or rates of cooling, and do not remain constant during prolonged heating of the element at elevated temperatures. For this reason, various alloys of tellurium have been investigated. The above mentioned article by Hornig et al. describes two tellurium-bismuth alloys respectively containing 0.4 and 0.5 percent by weight bismuth. These alloys, however, have relatively low thermal E. M. F. values, generally less than 200 microvolts per degree centigrade.

The elements of the present invention differ from the tellurium elements known heretofore in possessing the combination of high thermoelectric power, low electrical resistance, and linear temperature-E. M. F. curves. The thermoelectric power of the elements of the present invention as measured against copper ranges from about 300 microvolts per degree centigrade for the elements containing 0.1 percent bismuth up to about 360 microvolts per degree for the elements containing 0.01 percent bismuth. The electrical resistivity of the elements decreases rapidly with increased bismuth content from a maximum of about 0.03 ohm per cm. for the element containing 0.01 percent bismuth to less than 0.01 ohm per cm. for an element containing 0.1 percent bismuth. The test results on which the above thermal E. M. F. and resistivity values are based were obtained with a series of thermocouples in which the positive elements were cast tellurium-bismuth alloys containing different quantities of bismuth (which had been given a heat treatment at 270° C. for 500 hours) and the negative element was copper. The invention is not limited to this particular heat treatment. Similar results can be obtained at lower temperatures of, for example, 175° C. for a longer period of time. The thermocouples were operated at a hot junction temperature of 150° C. and a cold junction temperature of 50° C. The resistivity values for all of the elements were measured at 50° C.

Within the temperature range from 50 to 150° C., all of the elements of the present invention have linear or substantially linear temperature-E. M. F. curves. To obtain a curve of acceptable linearity, it has been found essential that the bismuth content be at least 0.01 percent, preferably from about 0.03 to 0.05 percent. Elements containing from 0.03 to 0.05 percent bismuth possess maximum stability. Elements containing less than 0.01 percent of bismuth including pure tellurium had nonlinear curves which were concave downward.

While the thermoelectric elements of the present invention can be used with any suitable negative element in the manufacture of themocouples, highly efficient thermocouples are obtained when the tellurium-bismuth element is used in combination with a second element having a high negative thermal E. M. F., such as the tellurium-silver element described in the copending application Serial No. 166,073, filed June 3, 1950, in the name of Harold T. Faus, now Patent No. 2,602,095, and assigned to the same assignee as the present invention. These tellurium-silver elements contain from 63 to 80 percent by weight silver, preferably about 65 percent by weight silver. However, the invention is not restricted to the use of any particular negative element and, for many applications, it has been found desirable to employ copper or constantan as the negative element.

What we claim as new and desire to secure by Letters Patent of the United States is:

1. A thermocouple having as a positive element an alloy consisting of tellurium and from 0.01 to 0.1 percent by weight bismuth, said element when against copper having a thermoelectric power of at least 300 microvolts per degree centigrade and an electrical resistivity no greater than 0.03 ohms per centimeter, the negative element of said thermocouple being one of the metals from the group comprising copper, constantan, and tellurium-silver alloys containing from 63% to 80% silver.

2. A thermocouple having as a positive element an alloy consisting of tellurium and from 0.03 to 0.1 percent by weight bismuth, said element when against copper having a thermoelectric power of at least 300 microvolts per degree centigrade and an electrical resistivity less than 0.03 ohms per centimeter, the negative element of said thermocouple being one of the metals from the group comprising copper, constantan, and tellurium-silver alloys containing from 63% to 80% silver.

3. A thermocouple having as a positive element an alloy consisting of tellurium and from 0.03 to 0.05 percent by weight bismuth, said element when against copper having a thermoelectric power of at least 300 microvolts per degree centigrade and an electrical resistivity less than 0.03 ohms per centimeter, the negative element of said thermocouple being one of the metals from the group comprising copper, constantan, and tellurium-silver alloys containing from 63% to 80% silver.

References Cited in the file of this patent

"Aufban der Zweistofflegierungen," by Hanse, 1943 edition, page 340, Abb. 160.

Metallische Werstoffe für Thermoelemente, A Schulze, published by Georg Lutke, Berlin, 1940, Fig. 19, p. 21, and Fig. 37, p. 40.

International Critical Tables of Numerical Data, Physics, Chemistry and Technology, vol. 6, 1929, pages 213–218.

Journal of Scientific Instruments, vol. 11, 1934, page 250.